(12) United States Patent
Wen

(10) Patent No.: US 11,852,680 B1
(45) Date of Patent: Dec. 26, 2023

(54) TEST DEVICE AND TEST METHOD THEREOF

(71) Applicant: NANYA TECHNOLOGY CORPORATION, New Taipei (TW)

(72) Inventor: Chih-Yuan Wen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/883,633

(22) Filed: Aug. 9, 2022

(51) Int. Cl.
*G01R 31/317* (2006.01)
*G06F 11/10* (2006.01)
*G06F 11/22* (2006.01)

(52) U.S. Cl.
CPC ........ *G01R 31/317* (2013.01); *G06F 11/1044* (2013.01); *G06F 11/2215* (2013.01); *G06F 2201/805* (2013.01)

(58) Field of Classification Search
CPC .............. G01R 31/317; G06F 11/1044; G06F 11/2215; G06F 2201/805
See application file for complete search history.

(56) References Cited

U.S. PATENT DOCUMENTS

| | | | | |
|---|---|---|---|---|
| 4,794,599 | A * | 12/1988 | Purcell | G01R 31/31915 714/719 |
| 6,295,617 | B1 * | 9/2001 | Sonobe | G06F 11/1008 714/E11.036 |
| 2007/0050668 | A1 | 3/2007 | Gans | |
| 2008/0235539 | A1 * | 9/2008 | Yamada | G01R 31/31919 714/703 |
| 2019/0176838 | A1 * | 6/2019 | Kakoee | B60W 50/0205 |
| 2021/0265003 | A1 | 8/2021 | Lee | |

FOREIGN PATENT DOCUMENTS

TW 201316340 4/2013

OTHER PUBLICATIONS

"Syndrome Generator Test Mode for On-chip Error Correction Code" by Fifield, JA IP.com Electronic Publication Date: Apr. 4, 2005 : IPCOM000122315D (Year: 2005).*
"Office Action of Taiwan Counterpart Application", dated Sep. 21, 2023, p. 1-p. 3.

* cited by examiner

*Primary Examiner* — Cynthia Britt
(74) *Attorney, Agent, or Firm* — JCIPRNET

(57) ABSTRACT

A test method includes: generating an error correction code according to a base data; dividing the base data into a plurality of base data sections; generating a plurality of candidate testing data according to the base data, wherein each of the candidate testing data has a plurality of testing data sections, and each of the testing data sections corresponds to each of the base data sections; and, performing a plurality of testing schemes. Each of the testing schemes includes: generating a plurality of write-in test data according to the plurality of candidate testing data, and writing the plurality of write-in test data with the error correction code into a tested device continuously; reading a plurality of mode register values of the tested device and a plurality of readout data from the tested device; and generating a test result according to the plurality of mode register value and the readout data.

16 Claims, 4 Drawing Sheets

| No. | Candidated testing data | | | | Examples | | | |
|---|---|---|---|---|---|---|---|---|
| | DQ[7:0] | DQ[15:8] | DMI0 | DMI1 | DQ[7:0](HEX) | DQ[15:8](HEX) | DMI0(BIN) | DMI1(BIN) |
| 1 | V | V | V | V | 5A,A5,69,96,F0,0F,AA,55 FF,00,33,CC,7E,E7,8F,70 | 5A,A5,69,96,F0,0F,AA,55 FF,00,33,CC,7E,E7,8F,70 | 1011010000111010 | 1011010000111010 |
| 2 | IS | V | V | IS | 5A,A5,69,96,F0,0F,A2,55 FF,00,33,CC,7E,E7,8F,70 | 5A,A5,69,96,F0,0F,AA,55 FF,00,33,CC,7E,E7,8F,70 | 1011010000111010 | 1011010000111000 |
| 3 | IS | IS | IS | IS | 5A,A5,69,96,F0,0F,A2,55 FF,00,33,CC,7E,E7,8F,70 | 5A,A5,69,96,F0,0F,A2,55 FF,00,33,CC,7E,E7,8F,70 | 1011010000111000 | 1011010000111000 |
| 4 | ID | V | ID | V | 5A,A5,69,96,F0,0F,A2,55 FF,00,33,CC,FE,E7,8F,70 | 5A,A5,69,96,F0,0F,AA,55 FF,00,33,CC,7E,E7,8F,70 | 1001010000111000 | 1011010000111010 |
| 5 | V | ID | V | ID | 5A,A5,69,96,F0,0F,AA,55 FF,00,33,CC,7E,E7,8F,70 | 5A,A5,69,96,F0,0F,A2,55 FF,00,33,CC,FE,E7,8F,70 | 1011010000111010 | 1001010000111000 |
| 6 | ID | ID | ID | ID | 5A,A5,69,96,F0,0F,A2,55 FF,00,33,CC,FE,E7,8F,70 | 5A,A5,69,96,F0,0F,A2,55 FF,00,33,CC,FE,E7,8F,70 | 0001010000111000 | 1001010000111000 |
| 7 | V | IS | IS | V | 5A,A5,69,96,F0,0F,AA,55 FF,00,33,CC,7E,E7,8F,70 | 5A,A5,69,96,F0,0F,A2,55 FF,00,33,CC,FE,E7,8F,70 | 1011010000111000 | 1011010000111010 |
| 8 | IS | ID | IS | ID | 5A,A5,69,96,F0,0F,A2,55 FF,00,33,CC,7E,E7,8F,70 | 5A,A5,69,96,F0,0F,A2,55 FF,00,33,CC,FE,E7,8F,70 | 1011010000111000 | 1001010000111000 |
| 9 | ID | IS | ID | IS | 5A,A5,69,96,F0,0F,A2,55 FF,00,33,CC,FE,E7,8F,70 | 5A,A5,69,96,F0,0F,A2,55 FF,00,33,CC,7E,E7,8F,70 | 1001010000111000 | 1011010000111000 |
| 10 | IS | V | V | V | 5A,A5,69,96,F0,0F,A2,55 FF,00,33,CC,7E,E7,8F,70 | 5A,A5,69,96,F0,0F,AA,55 FF,00,33,CC,7E,E7,8F,70 | 1011010000111010 | 1011010000111010 |
| 11 | V | V | IS | V | 5A,A5,69,96,F0,0F,AA,55 FF,00,33,CC,7E,E7,8F,70 | 5A,A5,69,96,F0,0F,AA,55 FF,00,33,CC,7E,E7,8F,70 | 1011010000111000 | 1011010000111010 |
| 12 | V | IS | V | V | 5A,A5,69,96,F0,0F,AA,55 FF,00,33,CC,7E,E7,8F,70 | 5A,A5,69,96,F0,0F,A2,55 FF,00,33,CC,7E,E7,8F,70 | 1011010000111010 | 1011010000111010 |
| 13 | V | V | V | IS | 5A,A5,69,96,F0,0F,AA,55 FF,00,33,CC,7E,E7,8F,70 | 5A,A5,69,96,F0,0F,AA,55 FF,00,33,CC,7E,E7,8F,70 | 1011010000111010 | 1011010000111000 |
| 14 | V | ID | V | V | 5A,A5,69,96,F0,0F,AA,55 FF,00,33,CC,7E,E7,8F,70 | 5A,A5,69,96,F0,0F,A2,55 FF,00,33,CC,FE,E7,8F,70 | 1011010000111010 | 1011010000111010 |
| 15 | V | V | V | ID | 5A,A5,69,96,F0,0F,AA,55 FF,00,33,CC,7E,E7,8F,70 | 5A,A5,69,96,F0,0F,AA,55 FF,00,33,CC,7E,E7,8F,70 | 1011010000111010 | 1001010000111000 |
| 16 | ID | V | V | V | 5A,A5,69,96,F0,0F,A2,55 FF,00,33,CC,FE,E7,8F,70 | 5A,A5,69,96,F0,0F,AA,55 FF,00,33,CC,7E,E7,8F,70 | 1011010000111010 | 1011010000111010 |
| 17 | V | V | ID | V | 5A,A5,69,96,F0,0F,AA,55 FF,00,33,CC,7E,E7,8F,70 | 5A,A5,69,96,F0,0F,AA,55 FF,00,33,CC,7E,E7,8F,70 | 1001010000111000 | 1011010000111010 |
| 18 | IS | V | IS | IS | 5A,A5,69,96,F0,0F,A2,55 FF,00,33,CC,7E,E7,8F,70 | 5A,A5,69,96,F0,0F,AA,55 FF,00,33,CC,7E,E7,8F,70 | 1011010000111000 | 1011010000111000 |
| 19 | IS | IS | ID | IS | 5A,A5,69,96,F0,0F,A2,55 FF,00,33,CC,7E,E7,8F,70 | 5A,A5,69,96,F0,0F,A2,55 FF 00 33 CC 7F F7 8F 70 | 1001010000111000 | 1011010000111000 |
| | ※V=Valid　　※IS=Invalid with SBE　　※ID=Invalid with DBE | | | | | | | |

FIG. 3

| Scheme | Testing Schems | Scheme | Testing Schems | Scheme | Testing Schems |
|---|---|---|---|---|---|
| (1) | Power up initialize ⇓ Mode Register Read-Ⓐ | (7) | WR 1-②, 2-⑦ ⇓ Mode Register Read-Ⓕ RD 1-①, 2-① ⇓ Mode Register Read-Ⓐ | (13) | WR 1-③, 2-⑭ ⇓ Mode Register Read-Ⓛ RD 1-①, 2-⑭ ⇓ Mode Register Read-Ⓐ |
| (2) | WR 1-①, 2-①, 3-① ⇓ Mode Register Read-Ⓐ RD 1-①, 2-①, 3-① | (8) | WR 1-②, 2-⑤ ⇓ Mode Register Read-Ⓖ RD 1-①, 2-⑤ ⇓ Mode Register Read-Ⓐ | (14) | WR 1-③, 2-⑮ ⇓ Mode Register Read-Ⓛ RD 1-①, 2-⑮ ⇓ Mode Register Read-Ⓐ |
| (3) | WR 1-①, 2-①, 3-① ⇓ Mode Register Read-Ⓑ RD 1-①, 2-①, 3-① ⇓ Mode Register Read-Ⓐ | (9) | WR 1-③, 2-⑩ ⇓ Mode Register Read-Ⓗ RD 1-①, 2-① ⇓ Mode Register Read-Ⓐ | (15) | WR 1-③, 2-⑯ ⇓ Mode Register Read-Ⓛ RD 1-①, 2-⑯ ⇓ Mode Register Read-Ⓐ |
| (4) | WR 1-③, 2-④, 3-⑤, 4-⑥ ⇓ Mode Register Read-Ⓒ RD 1-①, 2-④, 3-⑤, 4-⑥ ⇓ Mode Register Read-Ⓐ | (10) | WR 1-③, 2-⑪ ⇓ Mode Register Read-Ⓘ RD 1-①, 2-① ⇓ Mode Register Read-Ⓐ | (16) | WR 1-③, 2-⑰ ⇓ Mode Register Read-Ⓛ RD 1-①, 2-⑰ ⇓ Mode Register Read-Ⓐ |
| (5) | WR 1-③, 2-⑧ ⇓ Mode Register Read-Ⓓ RD 1-①, 2-⑤ ⇓ Mode Register Read-Ⓐ | (11) | WR 1-③, 2-⑫ ⇓ Mode Register Read-Ⓙ RD 1-①, 2-① ⇓ Mode Register Read-Ⓐ | (17) | WR 1-②, 2-⑪, 3-④, 4-③, 5-①, 6-⑱, 7-⑦, 8-⑰, 9-⑲ ⇓ Mode Register Read-Ⓜ RD 1-①, 2-④, 3-④, 4-①, 5-①, 6-①, 7-①, 8-⑰, 9-⑰ ⇓ Mode Register Read-Ⓐ |
| (6) | WR 1-③, 2-⑨ ⇓ Mode Register Read-Ⓔ RD 1-①, 2-④ ⇓ Mode Register Read-Ⓐ | (12) | WR 1-③, 2-⑬ ⇓ Mode Register Read-Ⓚ RD 1-①, 2-① ⇓ Mode Register Read-Ⓐ | | |

FIG. 4

| No. | Mode Register Read Situation List |||||||
|---|---|---|---|---|---|---|---|
| | MR43 ||| MR44 | MR45 |||
| | OP1[7] | OP1[5:0] (OP1[6]=0) | OP1[5:0] (OP1[6]=1) | OP2[7:0] | OP3[7] | OP3[6] | OP3[5:0] |
| Ⓐ | 0 | 000000 | 000000 | 0 | 0 | 0 | 0 |
| Ⓑ | 0 | 000001 | 000010 | ②/DQ[7:0] | 1 | 0 | ②/DMI 0 |
| Ⓒ | 1 | 000001 | 000100 | ③/DQ[7:0] | 1 | 0 | ③/DMI 0 |
| Ⓓ | 1 | 000010 | 000110 | ⑧/DQ[7:0] | 1 | 0 | ⑧/DMI 0 |
| Ⓔ | 1 | 000010 | 000110 | ⑨/DQ[15:8] | 1 | 1 | ⑨/DMI 1 |
| Ⓕ | 0 | 000010 | 000110 | ⑦/DQ[7:0] | 1 | 0 | ⑦/DMI 0 |
| Ⓖ | 1 | 000001 | 000010 | ②/DQ[7:0] | 1 | 0 | ②/DMI 0 |
| Ⓗ | 0 | 000010 | 000101 | ⑩/DQ[7:0] | 1 | 0 | ③/DMI 0 |
| Ⓘ | 0 | 000010 | 000101 | ③/DQ[7:0] | 1 | 0 | ⑪/DMI 0 |
| Ⓙ | 0 | 000010 | 000101 | ⑫/DQ[15:8] | 1 | 1 | ③/DMI 0 |
| Ⓚ | 0 | 000010 | 000101 | ③/DQ[7:0] | 1 | 1 | ⑬/DMI 1 |
| Ⓛ | 1 | 000001 | 000100 | ③/DQ[7:0] | 1 | 0 | ③/DMI 0 |
| Ⓜ | 1 | 000110 | 000111 | ⑲/DQ[7:0] | 1 | 0 | ⑦/DMI 0 |

TEST DEVICE AND TEST METHOD THEREOF

BACKGROUND OF THE INVENTION

Technical Field

The present invention generally relates to a test device and a test method thereof, and more particularly to the test method for Link-ECC (error correction code) function test.

Description of Related Art

Since more and more brand-new applications with critical response time and low power consumption requirement in the era of 5G (5th generation wireless systems) and AI (Artificial Intelligence) are generated, the low-power-high-speed device is essential for the system of these applications such as LPDDR5 (Low Power Double Data Rate 5) memory device. It provides 6400 Mbps data rate in maximum. However, it will be a hazard on the transmitting and receiving Link between a controller and the LPDDR5 memory device by various noise interference. Therefore, the LPDDR5 memory device is defined the Link ECC (Error Checking and Correction) function for the data exchange between the controller and the memory device to provide robust communication.

SUMMARY OF THE INVENTION

The present invention provides a test device and a test method thereof, and the test method is applied for a Link-ECC (Error Checking and Correction) function test of memory of LPDDR5 (Low Power Double Data Rate 5) or others memory devices.

The test method includes: generating an error correction code according to a base data; dividing the base data into a plurality of base data sections; generating a plurality of candidate testing data according to the base data, wherein each of the candidate testing data has a plurality of testing data sections, and each of the testing data sections corresponds to each of the base data sections; and, performing a plurality of testing schemes. Each of the testing schemes includes: generating a plurality of write-in test data according to the plurality of candidate testing data, and writing the plurality of write-in test data with the error correction code into a tested device continuously; reading a plurality of mode register values of the tested device and a plurality of readout data from the tested device; and, generating a test result according to the plurality of mode register value and the readout data.

The test device is adapted for testing a Link error correction code (ECC) function. The test device includes a controller. The controller is coupled to a tested device and is configured to: generate an error correction code according to a base data; divide the base data into a plurality of base data sections; generate a plurality of candidate testing data according to the base data, wherein each of the candidate testing data has a plurality of testing data sections, and each of the testing data sections corresponds to each of the base data sections; and, perform a plurality of testing schemes. The controller performs each of the plurality of testing schemes by: generating a plurality of write-in test data according to the plurality of candidate testing data, and writing the plurality of write-in test data with the error correction code into a tested device continuously; reading a plurality of mode register values of the tested device and a plurality of readout data from the tested device; and, generating a test result according to the plurality of mode register value and the readout data.

In summary, the test device generates a plurality of candidate testing data with a plurality of testing data sections. The test device also sets each of the testing data sections has one or two error bit(s) based on corresponding base data section. During each of a plurality of testing schemes, a plurality of write-in test data may be generated and write into a tested device with an error correction code by the test device, and a test result about the Link-ECC function can be obtained by reading a plurality of mode register values and a plurality of readout data from the tested device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 3, which illustrates a schematic diagram of a plurality of candidate testing data according to an embodiment of present disclosure.

FIG. 4 illustrates a flow diagram of the test schemes according to another embodiment of present disclosure.

DESCRIPTION OF THE EMBODIMENTS

Figure 1:
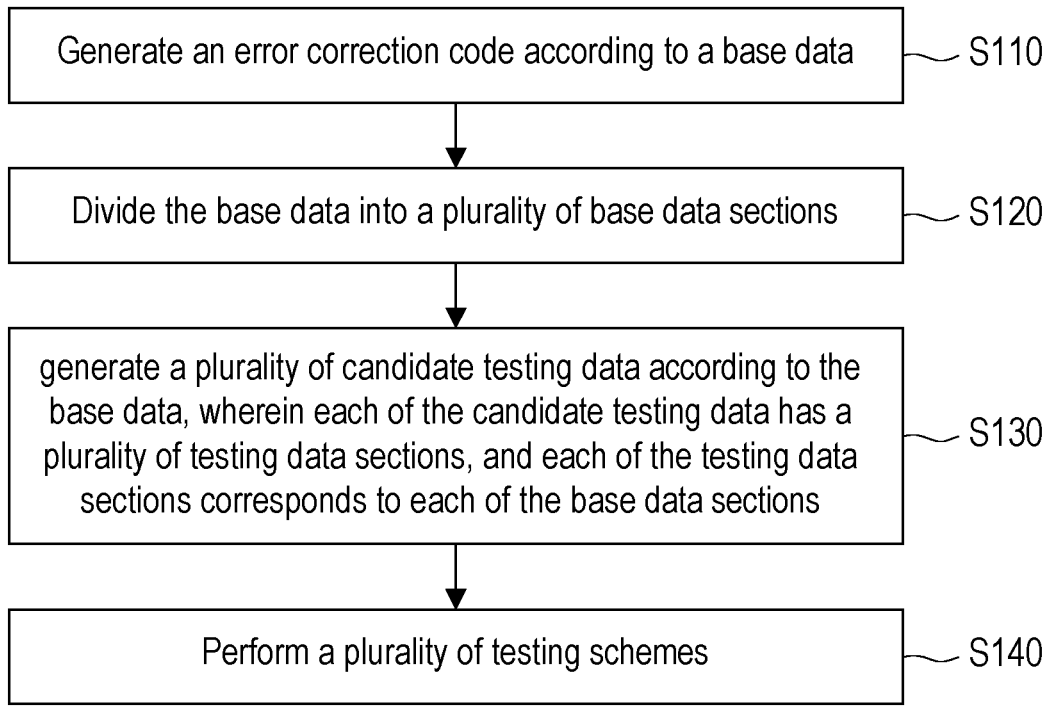
FIG. 1 illustrates a flow diagram of a test method according to an embodiment of present disclosure.

Reference will now be made in detail to the present preferred embodiment of the invention, examples of which are illustrated in the accompanying drawings. Wherever possible, the same reference numbers are used in the drawings and the description to refer to the same or like parts.

Please refer to FIG. 1, which illustrates a flow diagram of a test method according to an embodiment of present disclosure. The test method is adapted for test a Link-ECC function for a tested device. The tested device may be a memory of LPDDR5 (Low Power Double Data Rate 5) or any other type memory device. In a step S110, an error correction code (ECC) is generated according to a base data. In this embodiment, the ECC can be generated by an ECC encoder by encoding the base data according to an ECC algorithm with one error bit correction capability. In a step S120, the based data may be divided into a plurality of base data sections. In this embodiment, the base data may be divided into four data sections. For a tested device which is a dynamic random access memory (DRAM), the four data sections includes a first base data information, a second base data information, a first base data mask inversion information, and a second base data mask inversion information. In some embodiment, the first base data information may have 8 bits, the second base data information may also have 8 bits, the first base data mask inversion information may have 8 bits and the second base data mask inversion information may have 8 bits, too.

In a step S130, a plurality of candidate testing data can be generated according to the base data. In this embodiment, each of the candidate testing data has a plurality of testing data sections, and each of the testing data sections corresponds to each of the base data section. In detail each of the plurality of testing data sections may be a valid testing data section, a single-bit error section or a double-bits error data section. If the and the first testing data section is same as the first base data section. Take a first testing data section as an example where the first testing data section corresponds to the first base data section. If the first testing data section is the valid data section, the first testing data section is same as the first base data section; if the first testing data section is the single-bit error data section, there is a single bit error on the first testing data section compared with the first base data section; if the first testing data section is the double-bits error data section, there is two bits error on the first testing data section compared with the first base data section.

Please refer to FIG. 3, which illustrates a schematic diagram of a plurality of candidate testing data according to an embodiment of present disclosure. In this embodiment, 19 candidate testing data may be generated, and each of the first testing data section can be marked as "V" if each of the first testing data section is the valid data section; each of the first testing data section can be marked as "IS" if each of the first testing data section is the single-bit error data section (invalid); and each of the first testing data section can be marked as "DBE" if each of the first testing data section is the double-bits error data section (invalid).

For example, in the candidate testing data with No. 1, all of the testing data sections are all valid data sections, and the first testing data section DQ[7:0] of the candidate testing data with No. 1 may be 5A, A5, 69, 96, F0, 0F, AA, 55, FF, 00, 33, CC, 7E, E7, 8F and 70 in hex-decimal; the second testing data section DQ[15:8] of the candidate testing data with No. 1 may be 5A, A5, 69, 96, F0, 0F, AA, 55, FF, 00, 33, CC, 7E, E7, 8F and 70 in hex-decimal; the third testing data section DM0 of the candidate testing data with No. 1 may be 1011010000111010 in binary; and the fourth testing data section DM1 of the candidate testing data with No. 1 may be 1011010000111010 in binary. In the candidate testing data with No. 1, a first byte of the first testing data section DQ[7:0] may be complement to a second byte of the first testing data section DQ[7:0]; a third byte of the first testing data section DQ[7:0] may be complement to a fourth byte of the first testing data section DQ[7:0]; a fifth byte of the first testing data section DQ[7:0] may be complement to a sixth byte of the first testing data section DQ[7:0]; a seventh byte of the first testing data section DQ[7:0] may be complement to a eighth byte of the first testing data section DQ[7:0]. Also, in the candidate testing data with No. 1, a first byte of the second testing data section DQ[15:8] may be complement to a second byte of the second testing data section DQ[15:8]; a third byte of the second testing data section DQ[15:8] may be complement to a fourth byte of the second testing data section DQ[15:8]; a fifth byte of the second testing data section DQ[15:8] may be complement to a sixth byte of the second testing data section DQ[15:8]; a seventh byte of the second testing data section DQ[15:8] may be complement to a eighth byte of the second testing data section DQ[15:8].

Since all of the testing data sections of the candidate testing data with No. 1 are all valid data sections, the candidate testing data with No. 1 is same as the base data.

The candidate testing data with No. 2 may have four testing data sections which are marked as IS, V, V, IS, respectively. That is, a first testing data section and a fourth testing data section of the candidate testing data with No. 2 are single-bit error data sections, and a second testing data section and a third testing data section of the candidate testing data with No. 2 are valid data sections. In this embodiment, the first testing data section DQ[7:0] of the candidate testing data with No. 2 may be 5A, A5, 69, 96, F0, 0F, A2, 55, FF, 00, 33, CC, 7E, E7, 8F and 70 in hex-decimal, and the fourth testing data section DM1 of the candidate testing data with No. 2 may be 1011010000111000 in binary.

On the other hand, the candidate testing data with No. 3 may have four testing data sections which are marked as IS, IS, IS, IS, respectively; the candidate testing data with No. 4 may have four testing data sections which are marked as ID, V, ID, V, respectively; the candidate testing data with No. 5 may have four testing data sections which are marked as V, ID, V, ID, respectively; the candidate testing data with No. 6 may have four testing data sections which are marked as ID, ID, ID, ID, respectively; the candidate testing data with No. 7 may have four testing data sections which are marked as V, IS, IS, V, respectively; the candidate testing data with No. 8 may have four testing data sections which are marked as IS, ID, IS, ID, respectively; the candidate testing data with No. 9 may have four testing data sections which are marked as ID, IS, ID, IS, respectively; the candidate testing data with No. 10 may have four testing data sections which are marked as IS, V, V, V, respectively.

Furthermore, the candidate testing data with No. 11 may have four testing data sections which are marked as V, V, IS, V, respectively; the candidate testing data with No. 12 may have four testing data sections which are marked as V, IS, V, V, respectively; the candidate testing data with No. 13 may have four testing data sections which are marked as V, V, V, IS, respectively; the candidate testing data with No. 14 may have four testing data sections which are marked as V, ID, V, V, respectively; the candidate testing data with No. 15 may have four testing data sections which are marked as V, V, V, ID, respectively; the candidate testing data with No. 16 may have four testing data sections which are marked as ID, V, V, V, respectively; the candidate testing data with No. 17 may have four testing data sections which are marked as V, V, ID, V, respectively; the candidate testing data with No. 18 may have four testing data sections which are marked as IS, V, IS, IS, respectively; and the candidate testing data with No. 19 may have four testing data sections which are marked as IS, IS, ID, IS, respectively.

The first testing data sections DQ[7:0], the second testing data sections DQ[15:8], the third testing data sections DMI0, the fourth testing data sections DMI1 of the candidate testing data with No. 3 to No. 19 can be set as examples illustrated in FIG. 3. It should be noted here, an engineer can also set contents of the first testing data sections DQ[7:0], the second testing data sections DQ[15:8], the third testing data sections DMI0, the fourth testing data sections DMI1, the fourth testing data sections DMI1 of the candidate testing data with No. 3 to No. 19 by practical necessary, and the examples illustrated in FIG. 3 are only exemplary embodiment and not used to limit a scope of present disclosure.

It should be noted here, the engineer can set a number of the candidate testing data more or less than the candidate testing data shown in FIG. 3 by practical necessary. The candidate testing data with No. 1 to No. 19 in FIG. 3 are only exemplary embodiment and not used to limit a scope of present disclosure.

Figure 2:
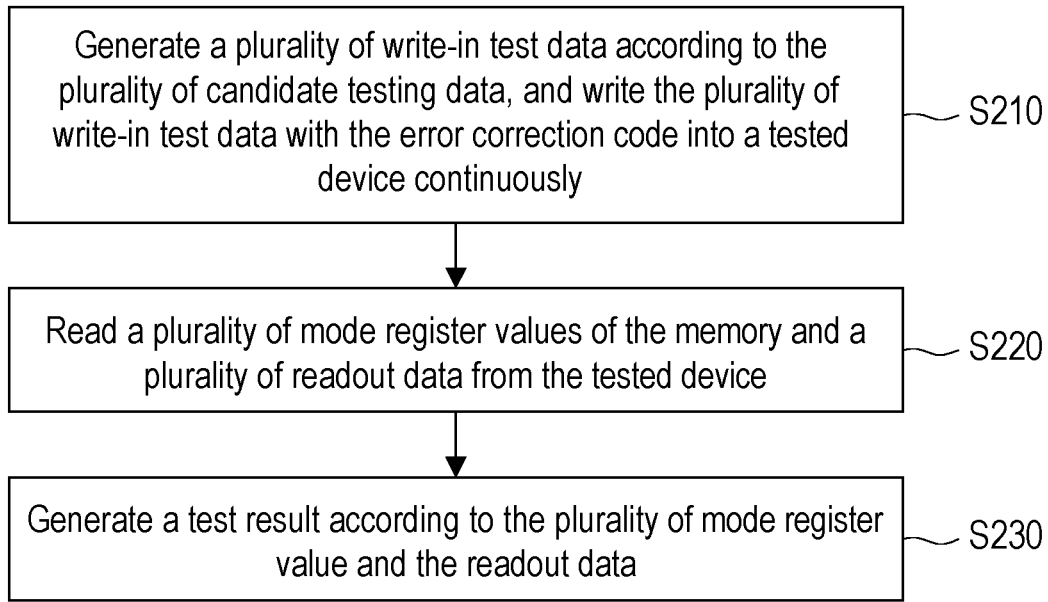
FIG. 2 illustrates a flow diagram of each of the plurality of testing schemes according to the embodiment of FIG. 1 of present disclosure.

Please re-refer to FIG. 1 again, after the step S130, a plurality of testing schemes can be performed on the tested device in a step S140. In detail, please refer to FIG. 2, which illustrates a flow diagram of each of the plurality of testing schemes according to the embodiment of FIG. 1 of present disclosure. In a step S210, a plurality of write-in test data are generated according to the plurality of candidate testing data, and the plurality of write-in test data are writing into the tested device continuously with the ECC. Then, in a step 220, a plurality of mode register values are read from the tested device, and a plurality of readout data are read from the tested device, too. In a step S230, a test result can be obtained according to the plurality of mode register values and the plurality of readout data.

Figures 5, 6:
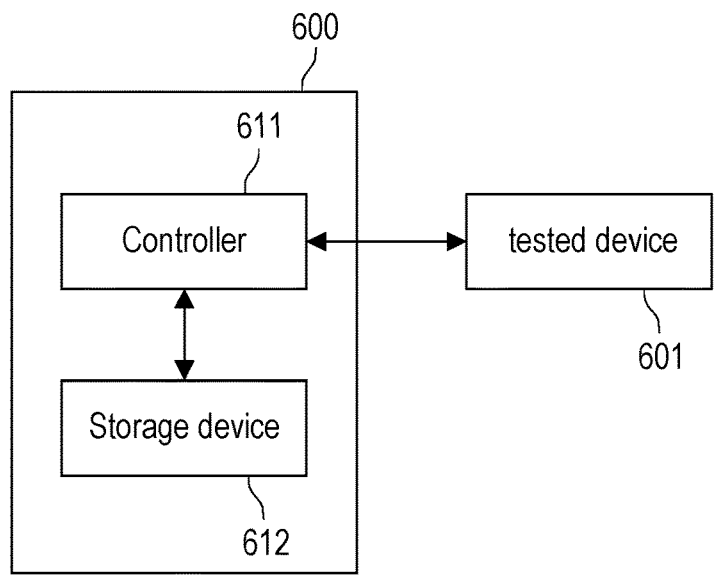
FIG. 5 illustrates a schematic diagram of a mode register read status list according to the embodiment of FIG. 4 of present disclosure.
FIG. 6 illustrates a test device according to an embodiment of present disclosure.

In detail, please refer to FIG. 4 and FIG. 5, wherein FIG. 4 illustrates a flow diagram of the test schemes according to another embodiment of present disclosure, and FIG. 5 illustrates a schematic diagram of a mode register read status list according to the embodiment of FIG. 4 of present disclosure. In this embodiment, the tested device may have registers MR43, MR44 and MR45. The registers MR43 has a plurality bits OP1[7:0] to form a first mode register value indicating a double bit error flag, a single bit error rule and a number of times for single bit error. In detail, the bit OP1[7] is a double bit error flag, the bit OP1[6] indicates the single bit error rule and the bits OP[5:0] indicate the number of times for single bit error during an ECC operation. In this embodiment, the bit OP1[6] can be defined by a user. The registers MR44 has a plurality bits OP2[7:0] to form a second mode register value indicating a syndrome value from a most recent single-bit error of the ECC operation. The registers MR45 has a plurality bits OP3[7:0] to form a third mode register value indicating a syndrome value for testing data information, an error byte lane and a syndrome value for data mask inversion information from the most recent single-bit error of the ECC operation. In detail, the bit OP3[7] indicates the syndrome value for testing data information, the bit OP3[6] indicates the error byte lane, and the bits OP3[5:0] indicate the syndrome value for data mask inversion information of the ECC operation.

Refer to FIG. 4, in a testing scheme (1), the tested device is power up initialized, and the mode registers of the tested device can be read. At this time, all the bits OP1[7:0], OP2[7:0] and OP3[7:0] of the registers MR43, MR44 and MR45 are all logic 0, and the register values with No. A can be obtained. In a testing scheme (2), three write-in test data WR1~WR3 as the candidate testing data with No. 1 which are all valid have been generated and are continuously written into the tested device. At this time, the register MR43, MR44 and MR45 are read, and the register values with No. A can be obtained. Furthermore, by reading readout data RD1~RD3 from the tested device, it will keep as originally (same as the candidate testing data with No. 1) since no correcting had been performed since all of the write-in test data are valid.

In a testing scheme (3), three write-in test data WR1~WR3 as the candidate testing data with No. 1, No. 2 and No. 1 respectively have been generated and are continuously written into the tested device. At this time, the registers MR43, MR44 and MR45 are read, and the register values with No. B can be obtained. The bits OP1[7] of the register MR43 should be logic 0 since there is no double-bits error occurred. The bits [5:0] of the register MR43 are logic 000001 in binary when the bit OP1[6] is logic 0; and the bits [5:0] of the register MR43 are logic 000010 in binary when the bit OP1[6] is logic 1. The bits OP2[7:0] of the register MR44 is logic 0; the bits [5:0] of the register MR43 are logic 000001 in binary when the bit OP1[6] is logic 0; and the bits [5:0] of the register MR43 are logic 000010 in binary when the bit OP1[6] is logic 1. Since there is single-bit error on the write-in test data WR2, the bits OP2[7:0] record the syndrome values corresponding to the first testing data section DQ[7:0] with No. 2 of the write-in test data WR2 and the bits OP3[7] and OP3[5:0] record the syndrome values corresponding to the first testing data inversion section DMI0 with No. 2 of the write-in test data WR2. Moreover, the bit OP3[6] is logic 0 due to only the error from a last byte will be stored if single bit error occurred.

Furthermore, by reading readout data RD1~RD3 from the tested device, the readout data RD1~RD3 should be the candidate testing data with No. 1, No. 1 and No. 1 respectively since the single bit error of the write-in test data WR2 has been corrected by the ECC operation. That is, by checking the register values and the readout data RD1~RD3, the Link-ECC function by the ECC operation can be tested, and a test result can be obtained.

It should be noted here, the register values of the registers MR43, MR44 and MR45 are cleared after the register values of the registers MR43, MR44 and MR45 have been read. Such as that, if the registers MR43, MR44 and MR45 are re-read again, the register values with No. A can be obtained.

In a testing scheme (4), four write-in test data WR1~WR4 as the candidate testing data with No. 3, No. 4, No. 5 and No. 6 respectively have been generated and are continuously written into the tested device. At this time, the register MR43, MR44 and MR45 are read, and the register values with No. C can be obtained. The bits OP1[7] of the register MR43 should be logic 1 since there is double-bits error occurred. The bits [5:0] of the register MR43 are logic 000001 in binary when the bit OP1[6] is logic 0; and the bits [5:0] of the register MR43 are logic 000100 in binary when the bit OP1[6] is logic 1. Since there is single-bit error on the write-in test data WR1, the bits OP2[7:0] of the register MR44 record the syndrome values corresponding to the first testing data section DQ[7:0] with No. 3 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0 due to only the error from a last byte will be stored if single bit error occurred.

Furthermore, by reading readout data RD1~RD4 from the tested device, the readout data RD1~RD3 should be the candidate testing data with No. 1, No. 4, No. 5 and No. 6 respectively since the single bit error of the write-in test data WR1 has been corrected by the ECC operation, and the double bit error of the write-in test data WR2 to WR4 are not corrected by the ECC operation.

If the registers MR43, MR44 and MR45 are re-read again, the register values with No. A can be obtained.

In a testing scheme (5), two write-in test data WR1 and WR2 as the candidate testing data with No. 3 and No. 8 respectively have been generated and are continuously written into the tested device. At this time, the register MR43, MR44 and MR45 are read, and the register values with No. D can be obtained. The bits OP1[7] of the register MR43 should be logic 1 since there is double-bits error occurred. The bits [5:0] of the register MR43 are logic 000010 in binary when the bit OP1[6] is logic 0; and the bits [5:0] of the register MR43 are logic 000110 in binary when the bit OP1[6] is logic 1. The bits OP2[7:0] of the register MR44 record the syndrome values corresponding to the first testing data section DQ[7:0] with No. 8 of the write-in test data WR2 and the bits OP3[7] and OP3[5:0] record the syndrome values corresponding to the first testing data inversion section DMI0 with No. 8 of the write-in test data WR2. Moreover, the bit OP3[6] is logic 0.

Furthermore, by reading readout data RD1 and RD2 from the tested device, the readout data RD1 and RD2 should be the candidate testing data with No. 1 and No. 4 respectively since the single bit errors of the write-in test data WR1 and WR2 have been corrected by the ECC operation.

If the registers MR43, MR44 and MR45 are re-read again, the register values with No. A can be obtained.

In a testing scheme (6), two write-in test data WR1 and WR2 as the candidate testing data with No. 3 and No. 9 respectively have been generated and are continuously written into the tested device. At this time, the register MR43, MR44 and MR45 are read, and the register values with No. E can be obtained. The bits OP1[7] of the register MR43 should be logic 1. The bits [5:0] of the register MR43 are logic 000010 in binary when the bit OP1[6] is logic 0; and the bits [5:0] of the register MR43 are logic 000110 in binary when the bit OP1[6] is logic 1.

The bits OP2[7:0] of the register MR44 record the syndrome values corresponding to the second testing data section DQ[15:8] with No. 9 of the write-in test data WR2 and the bits OP3[7] and OP3[5:0] record the syndrome values corresponding to the second testing data inversion section DMI1 with No. 9 of the write-in test data WR2. Moreover, the bit OP3 [6] is logic 1.

Furthermore, by reading readout data RD1 and RD2 from the tested device, the readout data RD1 and RD2 should be the candidate testing data with No. 1 and No. 4 respectively since the single bit errors of the write-in test data WR1 and WR2 have been corrected by the ECC operation.

If the registers MR43, MR44 and MR45 are re-read again, the register values with No. A can be obtained.

In a testing scheme (7), two write-in test data WR1 and WR2 as the candidate testing data with No. 2 and No. 7 respectively have been generated and are continuously written into the tested device. At this time, the register MR43, MR44 and MR45 are read, and the register values with No. F can be obtained. The bits OP1[7] of the register MR43 should be logic 0. The bits [5:0] of the register MR43 are logic 000010 in binary when the bit OP1[6] is logic 0; and the bits [5:0] of the register MR43 are logic 000110 in binary when the bit OP1[6] is logic 1. The bits OP2[7:0] of the register MR44 record the syndrome values corresponding to the first testing data section DQ[7:0] with No. 7 of the write-in test data WR2 and the bits OP3[7] and OP3[5:0] record the syndrome values corresponding to the first testing data inversion section DMI0 with No. 7 of the write-in test data WR2. Moreover, the bit OP3[6] is logic 0.

Furthermore, by reading readout data RD1 and RD2 from the tested device, the readout data RD1 and RD2 should be the candidate testing data with No. 1 and No. 4 respectively since the single bit errors of the write-in test data WR1 and WR2 have been corrected by the ECC operation.

If the registers MR43, MR44 and MR45 are re-read again, the register values with No. A can be obtained.

In a testing scheme (8), two write-in test data WR1 and WR2 as the candidate testing data with No. 2 and No. 5 respectively have been generated and are continuously written into the tested device. At this time, the register MR43, MR44 and MR45 are read, and the register values with No. G can be obtained. The bits OP1[7] of the register MR43 should be logic 1 since there is double bits error occurred. The bits [5:0] of the register MR43 are logic 000001 in binary when the bit OP1[6] is logic 0; and the bits [5:0] of the register MR43 are logic 000010 in binary when the bit OP1[6] is logic 1. The bits OP2[7:0] of the register MR44 record the syndrome values corresponding to the first testing data section DQ[7:0] with No. 2 of the write-in test data WR1 and the bits OP3[7] and OP3[5:0] record the syndrome values corresponding to the first testing data inversion section DMI0 with No. 2 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 1 respectively since the single bit errors of the write-in test data WR1 and WR2 have been corrected by the ECC operation.

If the registers MR43, MR44 and MR45 are re-read again, the register values with No. A can be obtained.

In a testing scheme (9), two write-in test data WR1 and WR2 as the candidate testing data with No. 3 and No. 10 respectively have been generated and are continuously written into the tested device. At this time, the register MR43, MR44 and MR45 are read, and the register values with No. H can be obtained. The bits OP1[7] of the register MR43 should be logic 0. The bits [5:0] of the register MR43 are logic 000010 in binary when the bit OP1[6] is logic 0; and the bits [5:0] of the register MR43 are logic 000101 in binary when the bit OP1[6] is logic 1. The bits OP2[7:0] of the register MR44 record the syndrome values corresponding to the first testing data section DQ[7:0] with No. 10 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 1 respectively since the single bit errors of the write-in test data WR1 and WR2 have been corrected by the ECC operation.

If the registers MR43, MR44 and MR45 are re-read again, the register values with No. A can be obtained.

In a testing scheme (10), two write-in test data WR1 and WR2 as the candidate testing data with No. 3 and No. 11 respectively have been generated and are continuously written into the tested device. At this time, the register MR43, MR44 and MR45 are read, and the register values with No. I can be obtained. The bits OP1[7] of the register MR43 should be logic 0. The bits [5:0] of the register MR43 are logic 000010 in binary when the bit OP1[6] is logic 0; and the bits [5:0] of the register MR43 are logic 000101 in binary when the bit OP1[6] is logic 1. The bits OP2[7:0] of the register MR44 record the syndrome values corresponding to the first testing data section DQ[7:0] with No. 3 of the write-in test data WR1 and the bits OP3[7] and OP3[5:0] record the syndrome values corresponding to the first testing data inversion section DMI0 with No. 11 of the write-in test data WR2. Moreover, the bit OP3[6] is logic 0.

Furthermore, by reading readout data RD1 and RD2 from the tested device, the readout data RD1 and RD2 should be the candidate testing data with No. 1 and No. 1 respectively since the single bit errors of the write-in test data WR1 and WR2 have been corrected by the ECC operation.

If the registers MR43, MR44 and MR45 are re-read again, the register values with No. A can be obtained.

In a testing scheme (11), two write-in test data WR1 and WR2 as the candidate testing data with No. 3 and No. 12 respectively have been generated and are continuously written into the tested device. At this time, the register MR43, MR44 and MR45 are read, and the register values with No. J can be obtained. The bits OP1[7] of the register MR43 should be logic 0. The bits [5:0] of the register MR43 are logic 000010 in binary when the bit OP1[6] is logic 0; and the bits [5:0] of the register MR43 are logic 000101 in binary when the bit OP1[6] is logic 1. The bits OP2[7:0] of the register MR44 record the syndrome values corresponding to the second testing data section DQ[15:8] with No. 12 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 1.

Furthermore, by reading readout data RD1 and RD2 from the tested device, the readout data RD1 and RD2 should be the candidate testing data with No. 1 and No. 1 respectively since the single bit errors of the write-in test data WR1 and WR2 have been corrected by the ECC operation.

If the registers MR43, MR44 and MR45 are re-read again, the register values with No. A can be obtained.

In a testing scheme (12), two write-in test data WR1 and WR2 as the candidate testing data with No. 3 and No. 13 respectively have been generated and are continuously written into the tested device. At this time, the register MR43, MR44 and MR45 are read, and the register values with No. K can be obtained. The bits OP1[7] of the register MR43 should be logic 0. The bits [5:0] of the register MR43 are logic 000010 in binary when the bit OP1[6] is logic 0; and the bits [5:0] of the register MR43 are logic 000101 in binary when the bit OP1[6] is logic 1. The bits OP2[7:0] of the register MR44 record the syndrome values corresponding to the first testing data section DQ[7:0] with No. 3 of the write-in test data WR1 and the bits OP3[7] and OP3[5:0] record the syndrome values corresponding to the second testing data inversion section DMI1 with No. 13 of the write-in test data WR2. Moreover, the bit OP3 [6] is logic 1.

Furthermore, by reading readout data RD1 and RD2 from the tested device, the readout data RD1 and RD2 should be the candidate testing data with No. 1 and No. 1 respectively since the single bit errors of the write-in test data WR1 and WR2 have been corrected by the ECC operation.

If the registers MR43, MR44 and MR45 are re-read again, the register values with No. A can be obtained.

In a testing scheme (13), two write-in test data WR1 and WR2 as the candidate testing data with No. 3 and No. 14 respectively have been generated and are continuously written into the tested device. At this time, the register MR43, MR44 and MR45 are read, and the register values with No. L can be obtained. The bits OP1[7] of the register MR43 should be logic 1. The bits [5:0] of the register MR43 are logic 000001 in binary when the bit OP1[6] is logic 0; and the bits [5:0] of the register MR43 are logic 000100 in binary when the bit OP1[6] is logic 1. The bits OP2[7:0] of the register MR44 record the syndrome values corresponding to the first testing data section DQ[7:0] with No. 3 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 14 respectively since the single bit errors of the write-in test data WR1 and WR2 have been corrected by the ECC operation.

If the registers MR43, MR44 and MR45 are re-read again, the register values with No. A can be obtained.

In a testing scheme (14), two write-in test data WR1 and WR2 as the candidate testing data with No. 3 and No. 15 respectively have been generated and are continuously written into the tested device. At this time, the register MR43, MR44 and MR45 are read, and the register values with No. L can be obtained. The bits OP1[7] of the register MR43 should be logic 1. The bits [5:0] of the register MR43 are logic 000001 in binary when the bit OP1[6] is logic 0; and the bits [5:0] of the register MR43 are logic 000100 in binary when the bit OP1[6] is logic 1. The bits OP2[7:0] of the register MR44 record the syndrome values corresponding to the first testing data section DQ[7:0] with No. 3 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 15 respectively since the single bit errors of the write-in test data WR1 and WR2 have been corrected by the ECC operation.

If the registers MR43, MR44 and MR45 are re-read again, the register values with No. A can be obtained.

In a testing scheme (15), two write-in test data WR1 and WR2 as the candidate testing data with No. 3 and No. 16 respectively have been generated and are continuously written into the tested device. At this time, the register MR43, MR44 and MR45 are read, and the register values with No. L can be obtained. The bits OP1[7] of the register MR43 should be logic 1. The bits [5:0] of the register MR43 are logic 000001 in binary when the bit OP1[6] is logic 0; and the bits [5:0] of the register MR43 are logic 000100 in binary when the bit OP1[6] is logic 1. The bits OP2[7:0] of the register MR44 record the syndrome values corresponding to the first testing data section DQ[7:0] with No. 3 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 16 respectively since the single bit errors of the write-in test data WR1 and WR2 have been corrected by the ECC operation.

If the registers MR43, MR44 and MR45 are re-read again, the register values with No. A can be obtained.

In a testing scheme (16), two write-in test data WR1 and WR2 as the candidate testing data with No. 3 and No. 17 respectively have been generated and are continuously written into the tested device. At this time, the register MR43, MR44 and MR45 are read, and the register values with No. L can be obtained. The bits OP1[7] of the register MR43 should be logic 1. The bits [5:0] of the register MR43 are logic 000001 in binary when the bit OP1[6] is logic 0; and the bits [5:0] of the register MR43 are logic 000100 in binary when the bit OP1[6] is logic 1. The bits OP2[7:0] of the register MR44 record the syndrome values corresponding to the first testing data section DQ[7:0] with No. 3 of the write-in test data WR2 and the bits OP3[7] and OP3[5:0] record the syndrome values corresponding to the first testing data inversion section DMI0 with No. 3 of the write-in test data WR1. Moreover, the bit OP3[6] is logic 0.

Furthermore, by reading readout data RD1 and RD2 from the tested device, the readout data RD1 and RD2 should be the candidate testing data with No. 1 and No. 17 respectively since the single bit errors of the write-in test data WR1 and WR2 have been corrected by the ECC operation.

If the registers MR43, MR44 and MR45 are re-read again, the register values with No. A can be obtained.

In a testing scheme (17), nine write-in test data WR1 to WR9 as the candidate testing data with No. 2, No. 4, No. 3, No. 1, No. 18, No. 7, No. 17 and No. 19 respectively have been generated and are continuously written into the tested device. At this time, the register MR43, MR44 and MR45 are read, and the register values with No. M can be obtained. The bits OP1[7] of the register MR43 should be logic 1. The bits [5:0] of the register MR43 are logic 000110 in binary when the bit OP1[6] is logic 0; and the bits [5:0] of the register MR43 are logic 001111 in binary when the bit OP1[6] is logic 1. The bits OP2[7:0] of the register MR44 record the syndrome values corresponding to the first testing data section DQ[7:0] with No. 19 of the write-in test data WR9 and the bits OP3[7] and OP3[5:0] record the syndrome values corresponding to the first testing data inversion section DMI0 with No. 7 of the write-in test data WR7. Moreover, the bit OP3[6] is logic 0.

Furthermore, by reading readout data RD1 to RD9 from the tested device, the readout data RD1 and RD2 should be the candidate testing data with No. 1, No. 1, No. 4, No. 1, No. 1, No. 1, No. 1, No. 17 and No. 17 respectively since the single bit errors of the write-in test data WR1 to WR9 have been corrected by the ECC operation.

If the registers MR43, MR44 and MR45 are re-read again, the register values with No. A can be obtained.

It can be seen, by applying the testing scheme (1) to the testing scheme (17) on the tested device, the Link-ECC function of the tested device can be well tested. Such as that, a reliability of data transmission of the tested device can be improved.

It should be noted here, the testing scheme (1) to the testing scheme (17) are exemplary embodiment only, and not used to limit a scope of present disclosure. A person skilled in this art may adjust a test order of the testing schemes. The person skilled in this art may also add at least one testing scheme or remove at least one testing scheme from the testing scheme (1) to the testing scheme (17) according to practical necessary.

Please refer to FIG. 6, which illustrates a test device according to an embodiment of present disclosure. The test device 600 is coupled to a tested device 601. The test device 600 includes a controller 611 and a storage device 612. The tested device 601 may be a dynamic random access memory or any other type memory. The controller 611 is coupled to the storage device 612. The controller 611 is configured to perform the test method as mentioned in previous embodiments. The storage device 612 may be any type of memory, and is configured to store the candidate testing data of FIG. 3. Moreover, the controller 611 is a processor having a computation function. Alternatively, the controller 611 may be a hardware circuit designed by using hardware description language (HDL) or any digital circuit design method well known by related technicians of the field, and implemented through a field programmable gate array (FPGA), a complex programmable logic device (CPLD) or an application-specific integrated circuit (ASIC).

In summary, a plurality of candidate testing data are provided in present test method, and each of the testing data sections of the candidate testing data may be the valid data, single bit error data or double bits error data. By writing a plurality of writ-in data generated according to the plurality of candidate testing data to perform each of a plurality of testing schemes, a test result can be obtained by the register values and the readout data of the tested device. The Link-ECC function can be tested well to enhance the reliability of a data transmission of the tested device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A test method, comprising:
   generating an error correction code according to a base data;
   dividing the base data into a plurality of base data sections;
   generating a plurality of candidate testing data according to the base data, wherein each of the candidate testing data has a plurality of testing data sections, and each of the testing data sections corresponds to each of the base data sections; and
   performing a plurality of testing schemes, and each of the testing schemes comprising:
   generating a plurality of write-in test data according to the plurality of candidate testing data, and writing the plurality of write-in test data with the error correction code into a tested device continuously;
   reading a plurality of mode register values of the tested device and a plurality of readout data from the tested device; and
   generating a test result according to the plurality of mode register value and the readout data.

2. The test method according to claim 1, wherein each of the testing data sections is valid data section, a single-bit error data section, or a double-bits error data section based on the error correction code.

3. The test method according to claim 1, wherein the plurality of base data sections comprises a first base data information, a second base data information, a first base data mask inversion information, and a second base data mask inversion information.

4. The test method according to claim 3, wherein the plurality of testing data sections comprises a first testing data information, a second testing data information, a first testing data mask inversion information, and a second testing data mask inversion information.

5. The test method according to claim 1, wherein a number of the write-in test data in each of the testing scheme is 2, 3 or 4.

6. The test method according to claim 1, wherein a first register value of the plurality of mode register values indicates a double bit error flag, a single bit error rule and a number of times for single bit error; the second register value of the plurality of mode register values indicates a syndrome value of an error correction code operation; and the third register value of the plurality of mode register values indicates a syndrome value for testing data information, an error byte lane and a syndrome value for data mask inversion information of the error correction code operation.

7. The test method according to claim 1, further comprising:
   clearing the plurality of mode register values after the plurality of mode register values have been readout.

8. A testing device, adapted for testing a Link error correction code (ECC) function, comprises:
   a controller, coupled to a tested device,
   wherein the controller is configured to:

generate an error correction code according to a base data;

divide the base data into a plurality of base data sections;

generate a plurality of candidate testing data according to the base data, wherein each of the candidate testing data has a plurality of testing data sections, and each of the testing data sections corresponds to each of the base data sections; and perform a plurality of testing schemes, and each of the testing schemes comprising:

generate a plurality of write-in test data according to the plurality of candidate testing data, and writing the plurality of write-in test data with the error correction code into a tested device continuously;

read a plurality of mode register values of the tested device and a plurality of readout data from the tested device; and generate a test result according to the plurality of mode register value and the readout data.

9. The testing device according to claim 8, further comprising:

a storage device, coupled to the controller, for storing the plurality of candidate testing data.

10. The testing device according to claim 8, wherein each of the testing data sections is valid data section, a single-bit error section, or a double-bits error section based on the error correction code.

11. The testing device according to claim 8, wherein the plurality of base data sections comprises a first base data information, a second base data information, a first base data mask inversion information, and a second base data mask inversion information.

12. The testing device according to claim 11, wherein the plurality of testing data sections comprises a first testing data information, a second testing data information, a first testing data mask inversion information, and a second testing data mask inversion information.

13. The testing device according to claim 8, wherein a number of the write-in test data in each of the testing scheme is 2, 3 or 4.

14. The testing device according to claim 8, wherein a first register value of the plurality of mode register values indicates a double bit error flag, a single bit error rule and a number of times for single bit error; the second register value of the plurality of mode register values indicates a syndrome value of an error correction code operation; and the third d register value of the plurality of mode register values indicates an error byte land and a syndrome value for data mask inversion information of the error correction code operation.

15. The testing device according to claim 14, wherein the plurality of mode register values are respectively recorded in a plurality of registers in the tested device.

16. The testing device according to claim 15, wherein tested device clears the plurality of mode register values after the plurality of mode register values have been readout.

* * * * *